(12) United States Patent
Hillard

(10) Patent No.: US 6,879,176 B1
(45) Date of Patent: Apr. 12, 2005

(54) CONDUCTANCE-VOLTAGE (GV) BASED METHOD FOR DETERMINING LEAKAGE CURRENT IN DIELECTRICS

(75) Inventor: Robert J. Hillard, Avalon, PA (US)

(73) Assignee: Solid State Measurements, Inc., Pittsburgh, PA (US)

(*) Notice: Subject to any disclaimer, the term of this patent is extended or adjusted under 35 U.S.C. 154(b) by 0 days.

(21) Appl. No.: 10/701,226

(22) Filed: Nov. 4, 2003

(51) Int. Cl.⁷ .......................... G01R 31/26; G01R 31/02
(52) U.S. Cl. ...................................... 324/765; 324/760
(58) Field of Search .................... 324/760, 765–767, 324/769; 438/14–18; 257/40–48

(56) References Cited

U.S. PATENT DOCUMENTS

| | | | |
|---|---|---|---|
| 4,360,964 A | | 11/1982 | Gilly et al. |
| 5,023,561 A | * | 6/1991 | Hillard ..................... 324/754 |
| 5,650,731 A | | 7/1997 | Fung et al. |
| 5,670,408 A | | 9/1997 | Yamamichi et al. |
| 5,786,689 A | | 7/1998 | Kimura |
| 5,841,294 A | | 11/1998 | Jang et al. |
| 6,008,664 A | | 12/1999 | Jett et al. |
| 6,492,827 B1 | * | 12/2002 | Mazur et al. ............... 324/761 |
| 6,538,462 B1 | * | 3/2003 | Lagowski et al. .......... 324/765 |
| 6,741,093 B2 | * | 5/2004 | Howland et al. ........... 324/765 |

| | | | |
|---|---|---|---|
| 2002/0030504 A1 | | 3/2002 | Hattori et al. |
| 2003/0040132 A1 | | 2/2003 | Yamanaka et al. |

FOREIGN PATENT DOCUMENTS

| | | | | |
|---|---|---|---|---|
| JP | 03214751 A | | 9/1991 | |
| JP | 04027134 A | | 1/1992 | |
| JP | 05198638 A | | 8/1993 | |
| JP | 06097250 A | | 4/1994 | |
| JP | 06148264 A | | 5/1994 | |
| WO | WO 02/077654 A1 | * | 10/2002 | ........... G01R/31/02 |

* cited by examiner

Primary Examiner—David Zarneke
Assistant Examiner—Jermele Hollington
(74) Attorney, Agent, or Firm—Webb Ziesenheim Logsdon Orkin & Hanson, P.C.

(57) ABSTRACT

A leakage current of a dielectric overlaying a semiconductor wafer can be determining by moving a conductive probe into contact with the dielectric and applying an electrical stimulus, in the form of a fixed amplitude, fixed frequency AC voltage superimposed on a DC voltage which is swept from a starting voltage towards an ending voltage, between the probe tip and the semiconductor wafer. Conductance values associated with the dielectric and the semiconductor wafer can be determined from phase angles between the AC voltage and an AC current resulting from the applied AC voltage during the sweep of the DC voltage. The leakage current of the dielectric can then be determined from the thus determined conductance values.

15 Claims, 3 Drawing Sheets

CONDUCTANCE-VOLTAGE (GV) BASED METHOD FOR DETERMINING LEAKAGE CURRENT IN DIELECTRICS

BACKGROUND OF THE INVENTION

1. Field of the Invention

The present invention relates to determining the quality of a dielectric on a semiconductor wafer.

2. Description of Related Art

A semiconductor wafer utilized to form integrated circuits typically includes a dielectric overlaying a top surface of the semiconductor wafer. Prior to processing the semiconductor wafer to form arrays of integrated circuits thereon, it is desirable to determine various parameters associated with the dielectric. Two such parameters include equivalent oxide thickness (EOT) and leakage current ($I_{leak}$).

Heretofore, separate instrumentation and probes were utilized to measure these parameters. However, the use of separate instrumentation and probes increases the difficulty, cost and throughput of such measurements. In addition, the measurement of leakage current heretofore required the use of two frequencies.

It is, therefore, desirable to overcome the above problems and others by providing a method wherein leakage current can be determined utilizing a single frequency. It is also desirable to provide a method where measurements utilized to determine leakage current of a dielectric can also be utilized to derive other parameters of interest for the dielectric.

SUMMARY OF THE INVENTION

The invention is a method of determining leakage current of a dielectric overlaying a semiconductor wafer. The method includes providing a semiconductor wafer having a dielectric overlaying at least part of the semiconductor wafer and providing a probe having an elastically deformable conductive tip. The probe tip is caused to move into contact with the dielectric and a DC voltage having an AC voltage superimposed thereon is applied between the probe tip and the semiconductor wafer. The DC voltage is then swept from a first DC voltage toward a second DC voltage. Phase angles between the AC voltage and an AC current flowing through the dielectric in response to the AC voltage during the sweep of the DC voltage are acquired. Changes in the conductance of the semiconductor wafer and the dielectric as a function of changes in the voltage of the swept DC voltage are determined from the acquired phase angles. Based on the thus determined changes in the conductance, a leakage current of the dielectric is determined.

The step of determining changes in the conductance as a function of changes in the voltage of the swept DC voltage can include determining from the acquired phase angles changes in a resistance of the semiconductor wafer and the dielectric as a function of changes in the voltage of the swept DC voltage. From the thus determined changes in the resistance, the changes in the conductance of the semiconductor wafer and the dielectric as a function of changes in the voltage of the swept DC voltage can be determined.

The step of determining the leakage current can include determining the leakage current from the changes in conductance versus the changes in the voltage of the swept DC voltage. More specifically, determining the leakage current can include determining a slope of the changes in the conductance versus changes in the voltage of the swept DC voltage for one or more DC voltages when the semiconductor wafer is in a state of accumulation.

Also or alternatively, determining the leakage current can include determining a first derivative of the changes in the conductance as a function of changes in the voltage of the swept DC voltage and mathematically combining (multiplying) a value of a voltage when the semiconductor wafer is in a state of accumulation with the first derivative to obtain the leakage current.

Desirably, the AC voltage has a constant amplitude and fixed frequency.

The invention is also a method of determining leakage current of a dielectric that overlays a semiconductor wafer that includes causing a conductive probe tip to contact a dielectric formed on a semiconductor wafer and applying between the probe tip and the semiconductor wafer an electrical stimulus that causes the semiconductor wafer to transition between a state of accumulation and a state of depletion, or vice versa. From the applied electrical stimulus, conductance values of the dielectric and the semiconductor wafer can be determined. A leakage current of the dielectric can then be determined from the thus determined conductance values.

The electrical stimulus desirably includes an AC voltage superimposed on a DC voltage which is swept from a first DC voltage toward a second DC voltage. The AC voltage desirably has a constant amplitude and a constant frequency.

The leakage current is desirably determined from a change in conductance values versus a change in the DC voltage during the sweep thereof. The change in the conductance values versus the change in the DC voltage during the sweep thereof is desirably determined when the semiconductor wafer is in a state of accumulation. The step of determining conductance values can include determining phase angles between the AC voltage and an AC current resulting from applying the AC voltage between the probe tip and the semiconductor wafer during the sweep of the DC voltage and determining the conductance values from the phase angles.

DETAILED DESCRIPTION OF THE INVENTION

The present invention will be described with reference to the accompanying figures where like reference numbers correspond to like elements.

Figure 1:
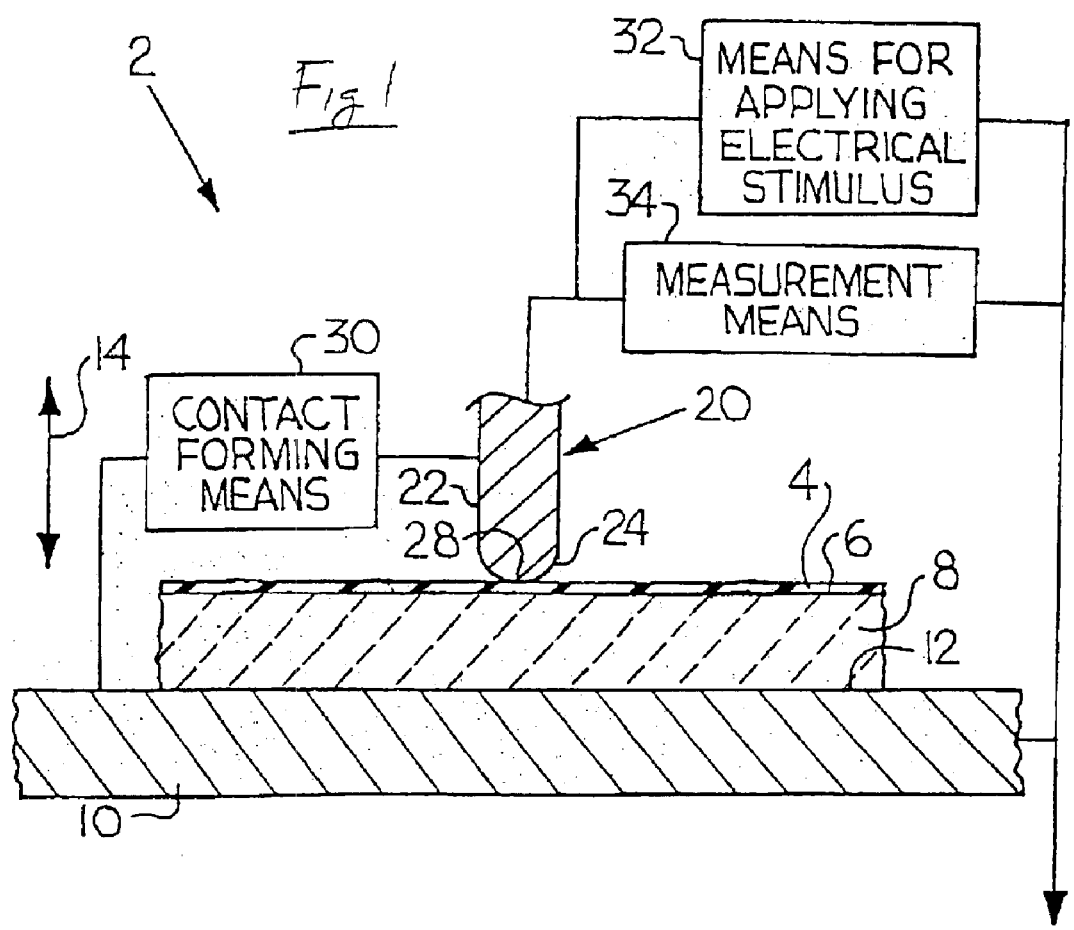
FIG. 1 is a mixed block diagram and cross-sectional side view of a system for detecting leakage current of a dielectric overlaying a semiconductor wafer.

With reference to FIG. 1, an apparatus 2 for measuring leakage current of a dielectric, such as dielectric layer 4, overlaying a topside 6 of a semiconductor wafer 8 includes an electrically conductive vacuum chuck 10 for holding a backside 12 of semiconductor wafer 8 by means of a vacuum (not shown). Apparatus 2 also includes a probe 20 having a shaft 22 with a conductive tip 24 at one end thereof.

Contact forming means 30, of the type well known in the art, controls the vertical movement of chuck 10 and/or probe 20, in the directions shown by arrow 14, to move probe 20 and semiconductor wafer 8 toward each other whereupon a distal end 28 of conductive tip 24 presses into contact with dielectric 4. The combination of distal end 28 of conductive tip 24 in contact with dielectric 4 overlaying semiconductor wafer 8 forms a capacitor C (See FIG. 2), wherein conductive tip 24 and semiconductor wafer 8 define the conductive plates of capacitor C and dielectric 4 defines the dielectric between the plates of capacitor C.

A means for applying electrical stimulus 32 and a measurement means 34 are connected in parallel between conductive tip 24 and chuck 10. Chuck 10 is typically connected to a reference ground. However, this is not to be construed as limiting the invention since chuck 10 can alternatively be connected to an AC or DC reference bias.

Conductive tip 24 is formed from an elastically deformable material such a smooth, highly polished metal, e.g., tantalum, a conductive elastomer or a conductive polymer. Desirably, conductive tip 24 has a hemispherical shape having a radius of curvature between 10 micrometers and 100 centimeters. However, this is not to be construed as limiting the invention.

Figure 2:
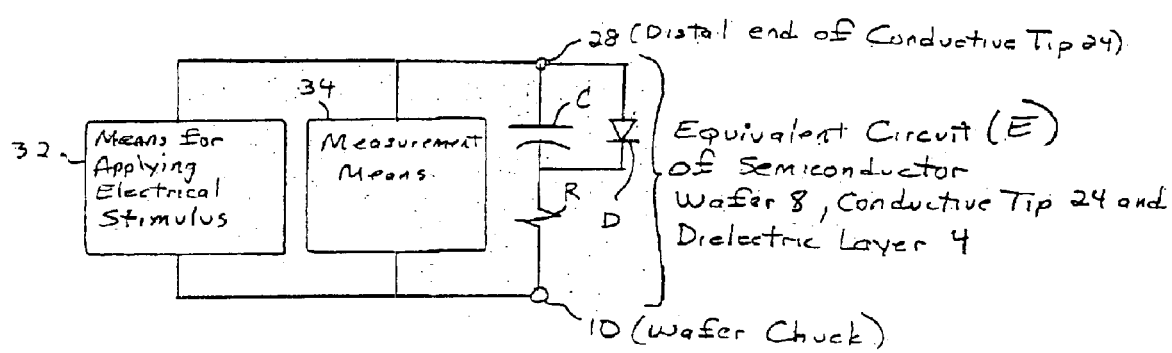
FIG. 2 is a view of the system shown in FIG. 1 including a circuit equivalent of the probe, dielectric, semiconductor wafer and chuck shown in FIG. 1.

With reference to FIG. 2 and with continuing reference to FIG. 1, as discussed above, the combination of distal end 28 of conductive tip 24 in contact with dielectric 4 overlaying semiconductor wafer 8 forms capacitor C. In addition, this combination also has associated therewith has a resistance R, which is primarily due to the resistance of semiconductor wafer 8, and a diode D in parallel with capacitor C, that represents the tunneling leakage current across capacitor C. Hence, conductive tip 24 in contact with dielectric 4 overlaying semiconductor wafer 8 can be modeled by an equivalent circuit E that includes a resistor R in series with the parallel combination of capacitor C and diode D as shown in FIG. 2.

Figure 3:
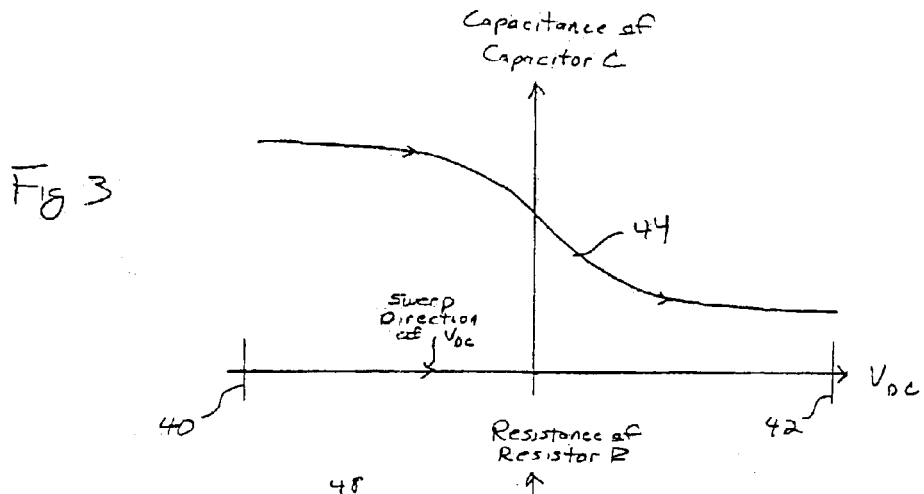
FIG. 3 is a graph of the change in capacitance of the capacitor shown in FIG. 2 versus a change in voltage.

With reference to FIG. 3 and with continuing reference to FIGS. 1 and 2, once conductive tip 24 is in contact with dielectric 4, the means for applying electrical stimulus 32 applies between conductive tip 24 and chuck 10 a CV-type electrical stimulus comprising a fixed amplitude, fixed frequency AC voltage superimposed on a DC voltage which is swept from a first, starting voltage 40, where semiconductor wafer 8 is in accumulation, to a second, ending voltage 42, where semiconductor wafer 8 is in depletion, or vice versa. During the sweep of the DC voltage, phase angles between the AC voltage and an AC current flowing through dielectric 4 in response to said AC voltage are acquired. These phase angles result from the phase shifting effect of capacitor C, diode D and resistance R of equivalent circuit E. To this end, it has been observed that the capacitance of capacitor C and/or the conduction through diode D can vary as a function of the applied DC voltage during application of the CV-type electrical stimulus between conductive tip 24 and chuck 10 as a result of semiconductor wafer 8 transitioning between a state of accumulation and a state of depletion. Since one or both of the capacitance of capacitor C and the conductance of diode D change during the sweep of the applied DC voltage, the phase angle between the AC voltage superimposed on the swept DC voltage and the AC current resulting from the application of said AC voltage changes as a function of the applied DC voltage.

Figure 4:
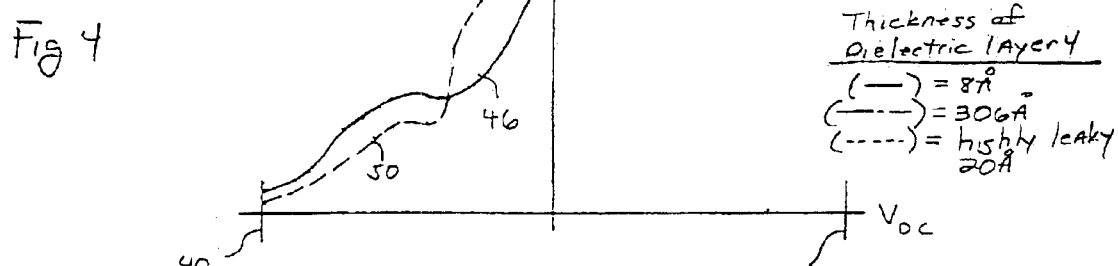
FIG. 4 shows three graphs of a change in the resistance of the resistor shown in FIG. 2 versus a change in voltage for three different thicknesses of the dielectric.

Utilizing well known phasor analysis techniques, the capacitance of capacitor C and the resistance of resistor R at each point of the sweep of the DC voltage between starting voltage 40 and ending voltage 42 can be determined from the amplitude and frequency of the applied AC voltage and the acquired phase angle at each said point Exemplary graphs of the capacitance of capacitor C and the resistance of resistor R for the sweep of DC voltage between starting voltage 40 and ending voltage 42 are shown by curves 44 and 46 in FIGS. 3 and 4, respectively, for a dielectric 4 having a thickness of 8 angstroms (Å). FIG. 4 also includes a curve 48 of the resistance of resistor R for a dielectric 4 having a thickness of 306 Å. Lastly, FIG. 4 includes a curve 50 of the resistance of resistor R for a highly leaky dielectric 4 having a thickness of 20 Å.

Figure 5:
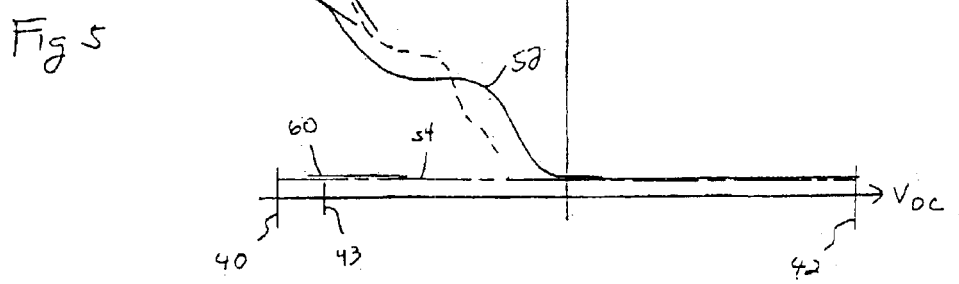
FIG. 5 shows three graphs of changes in the conductance of the circuit shown in FIG. 2 versus changes in voltage.

With reference to FIG. 5 and with continuing reference to FIGS. 1–4, curve 46 of the resistance of resistor R can be converted into a curve 52 of conductance G between starting voltage 40 and ending voltage 42 by simply dividing the real number one (1) by the value of the resistance R, i.e., 1/R, at each point along curve 46. In a similar manner, conductance curves 54 and 56 in FIG. 5 can be derived from resistance curves 48 and 50, respectively, in FIG. 4.

Once conductance curve 52 has been determined, the leakage current ($I_{leak}$) flowing through dielectric 4 can be determined from the slope of a line 58 tangent to curve 52 at a voltage, e.g., voltage 43 adjacent starting voltage 40, where semiconductor wafer 8 is in a state of accumulation during the sweep of the DC voltage. More specifically, the value of $I_{leak}$ can be determined from the slope of tangent line 58 utilizing the following equation:

$$I_{leak} = (dG/dV)V_{sec}^2$$

where dG/dV = slope of tangent line 58; and
$V_{sec}$ = a voltage, e.g., voltage 43, where semiconductor wafer 8 is in a state of accumulation during the sweep of the DC voltage.

Also or alternatively, a first derivative of conductance curve 52 can be determined and $I_{leak}$ flowing through dielectric 4 can be determined mathematically by combining (multiplying) this first derivative with the square of a voltage, e.g., voltage 43, where semiconductor wafer 8 is in a state of accumulation during the sweep of the DC voltage. In a similar manner, the slopes of lines 60 and 62 tangent to curves 54 and 56, respectively, at a voltage, e.g., voltage 43, where semiconductor wafer 8 is in a state of accumulation during the sweep of the DC voltage can be determined and the leakage current of the corresponding dielectric 4 determined therefrom. Also or alternatively, the first derivatives of curves 54 and 56 can be determined and each of these first derivatives can be mathematically combined (multiplied) with the square of a voltage, e.g., voltage 43, where semiconductor wafer 8 is in a state of accumulation during the sweep of the DC voltage to determine the value of $I_{leak}$.

The plots shown in FIGS. 3–5 result from the CV-type electrical stimulus of semiconductor wafer 8 formed from P-type silicon. A mirror-image of the plots shown in FIGS. 3–5 would result from an electrical stimulus utilized for semiconductor wafer 8 formed from N-type silicon.

As can be determined from FIG. 5, the slope of curve 56 and, hence, the leakage current of a highly leaky, 20 angstrom dielectric 4 is greater than the slope of curve 52 and, hence, the leakage current associated with a properly functioning 8 Å dielectric 4. In addition, the leakage current determined from curve 52 for the properly functioning 8 Å dielectric 4 is much greater than the leakage current determined from curve 54 for a properly operating 306 Å dielectric 4. Thus, as would be apparent to one of ordinary skill in the art the leakage current for a dielectric determined in the above-described manner can be utilized as a measure of the efficacy of the dielectric. To this end, semiconductor wafers having dielectrics with a leakage current outside of a predetermined range of leakage currents can be deemed to be unsuitable for future use and, hence, discarded before further, expensive processing thereof.

As can be seen, a CV-type electrical stimulus can be utilized to not only determine the change of capacitance as a function of a change in DC voltage wherefrom parameters of a dielectric, such as EOT, can be determined, but also to determine a change in conductance as a function of the change in DC voltage wherefrom the leakage current of the dielectric can be determined. Hence, with the application of one CV-type electrical stimulus, multiple parameters of a dielectric and/or a semiconductor wafer can be determined.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of determining leakage current of dielectric overlaying a semiconductor wafer comprising:
   (a) providing a semiconductor wafer having a dielectric overlaying at least part of the semiconductor wafer;
   (b) providing a probe having an elastically deformable conductive tip;
   (c) causing the probe tip to contact the dielectric;
   (d) applying a DC voltage having an AC voltage superimposed thereon between the probe tip and the semiconductor wafer;
   (e) sweeping the applied DC voltage having the AC voltage superimposed thereon from a first DC voltage toward a second DC voltage;
   (f) acquiring phase angles between the AC voltage and an AC current flowing through the dielectric in response to said AC voltage during the sweep of the DC voltage;
   (g) determining from the acquired phase angles, changes in a conductance of the semiconductor wafer and the dielectric as a function of changes in the voltage of the swept DC voltage; and
   (h) determining a leakage current of the dielectric from the changes in the conductance.

2. The method of claim 1, wherein step (g) includes:
   determining from the phase angles acquired in step (f), changes in a conductance of the semiconductor wafer and the dielectric as a function of changes in the voltage of the swept DC voltage.

3. The method of claim 1, wherein step (h) includes determining the leakage current from the changes in the conductance versus the changes in the voltage of the swept DC voltage.

4. The method of claim 3, wherein step (h) includes determining a slope of the changes in the conductance versus the changes in the voltage of the swept DC voltage for a DC voltage where the semiconductor wafer is in a state of accumulation.

5. The method of claim 3, wherein step (h) includes:
   determining a first derivative of the changes in the conductances determined in step (g); and
   mathematically combining a voltage where the semiconductor wafer is in a state of accumulation with the first derivative to obtain the leakage current.

6. The method of claim 1, wherein the elastically deformable conductive tip is formed from one of:
   a conductive metal;
   a conductive elastomer; and
   a conductive polymer.

7. The method of claim 1, wherein the AC voltage has a constant amplitude.

8. A method of determining leakage current of a dielectric overlaying a semiconductor wafer comprising:
   (a) causing a conductive probe tip to contact a dielectric formed on a semiconductor wafer;
   (b) applying between the probe tip and the semiconductor wafer an electrical stimulus that causes the semiconductor wafer to transition between a state of accumulation and a state of depletion, or vice versa;
   (c) determining from the applied electrical stimulus, conductance values of the dielectric and the semiconductor wafer; and
   (d) determining a leakage current of the dielectric from the conductance values determined in step (c).

9. The method of claim 8, wherein the electrical stimulus includes an AC voltage superimposed on a DC voltage which is swept from a first DC voltage toward a second DC voltage.

10. The method of claim 9, wherein the AC voltage has a constant amplitude.

11. The method of claim 9, wherein the leakage current is determined from a change in the conductance values versus a change in the DC voltage during the sweep thereof.

12. The method of claim 11, wherein the change in the conductance values versus the change in the DC voltage during the sweep thereof is determined at a voltage where the semiconductor wafer is in a state of accumulation.

13. The method of claim 8, wherein the conductive probe tip is elastically deformable.

14. The method of claim 13, wherein the elastically deformable conductive probe tip is formed from one of:
   a conductive metal;
   a conductive elastomer; and
   a conductive polymer.

15. The method of claim 9, wherein step (c) includes:
   determining phase angles between the AC voltage and an AC current resulting from applying the AC voltage between the probe tip and the semiconductor wafer during the sweep of the DC voltage; and
   determining the conductance values from the phase angles.

* * * * *

UNITED STATES PATENT AND TRADEMARK OFFICE
CERTIFICATE OF CORRECTION

PATENT NO. : 6,879,176 B1
DATED : April 12, 2005
INVENTOR(S) : Hillard

It is certified that error appears in the above-identified patent and that said Letters Patent is hereby corrected as shown below:

<u>Title page,</u>
Item [57], ABSTRACT,
Line 2, "can be determining" should read -- can be determined --.

Signed and Sealed this

Twentieth Day of September, 2005

JON W. DUDAS
*Director of the United States Patent and Trademark Office*